(12) United States Patent
Nakamura

(10) Patent No.: US 8,269,216 B2
(45) Date of Patent: Sep. 18, 2012

(54) SEMICONDUCTOR DEVICE, METHOD OF MANUFACTURING SEMICONDUCTOR DEVICE, AND ELECTRONIC APPARATUS

(75) Inventor: Kiyoshi Nakamura, Suwa-gun (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/027,652

(22) Filed: Feb. 15, 2011

(65) Prior Publication Data

US 2011/0204346 A1 Aug. 25, 2011

(30) Foreign Application Priority Data

Feb. 19, 2010 (JP) ................. 2010-034381

(51) Int. Cl.
*H01L 51/00* (2006.01)

(52) U.S. Cl. .............. 257/40; 438/99; 257/E51.001; 257/E51.024

(58) Field of Classification Search ............ 257/40, 257/E51.001, E51.024; 438/99
See application file for complete search history.

(56) References Cited

U.S. PATENT DOCUMENTS

| 6,919,158 B2 | 7/2005 | Kawamura et al. | |
| 7,595,505 B2 * | 9/2009 | Aoki ........................ | 257/40 |
| 2006/0084206 A1 | 4/2006 | Moriya et al. | |
| 2007/0212807 A1 * | 9/2007 | Yamada et al. ............. | 438/99 |
| 2007/0254429 A1 * | 11/2007 | Cho et al. .................. | 438/239 |
| 2008/0061288 A1 | 3/2008 | Tomono et al. | |
| 2010/0155710 A1 * | 6/2010 | Lee et al. ................... | 257/40 |
| 2011/0248248 A1 * | 10/2011 | Ukeda ....................... | 257/40 |

FOREIGN PATENT DOCUMENTS

| JP | 2003-076004 A | 3/2003 |
| JP | 2006-140451 A | 6/2006 |
| JP | 2008-066567 A | 3/2008 |

* cited by examiner

*Primary Examiner* — William D Coleman
*Assistant Examiner* — Christine Enad
(74) *Attorney, Agent, or Firm* — AdvantEdge Law Group, LLC

(57) ABSTRACT

A semiconductor device including: a substrate; a first electrode and a second electrode, each being formed on the substrate; a first region that is positioned between the first electrode and the second electrode; a second region that is connected with the first region; an organic semiconductor layer that is provided in the first region and in the second region; and a receptor of the organic semiconductor layer, the receptor being provided so as to surround the second region and having an opening that extends from the second region to the first region.

11 Claims, 14 Drawing Sheets

SEMICONDUCTOR DEVICE, METHOD OF MANUFACTURING SEMICONDUCTOR DEVICE, AND ELECTRONIC APPARATUS

CROSS-REFERENCE TO RELATED APPLICATION

This application is based on and claims priority from Japanese Patent Application No. 2010-034381, filed on Feb. 19, 2010, the contents of which are incorporated herein by reference.

BACKGROUND

1. Technical Field

The present invention relates to a semiconductor device manufactured by using an organic semiconductor, relates to a method of manufacturing the semiconductor device, and relates to an electronic apparatus.

2. Related Art

For example, an organic semiconductor is used for the semiconductor layer of a transistor of electronic paper or the like having a small thickness, a light weight, and appropriate flexibility. Such an organic semiconductor layer is formed as a result of, for example, ejecting droplets of an organic semiconductor material by using an ink jet technique.

In recent years, transistors have come to have fine structures in order to improve electric properties. Unfortunately, in the case where droplets of an organic semiconductor material are ejected onto the channel region of a transistor, are not appropriately held within the channel region (channel length) and then overflow to the periphery, a leak current flows between wires, and thereby the driving and display properties of a device are significantly affected. Therefore, such a phenomenon has been problematic.

In order to prevent such a problem, for example, techniques that are disclosed in JP-A-2003-76004 and JP-A-2006-140451 are employed. The techniques propose that a structure is formed around the channel region and that lyophilic treatment and liquid repellent treatment are performed to prevent overflow of liquid to other regions, thereby precisely manufacturing a transistor.

However, the formation of the structure, the lyophilic treatment, and the liquid repellent treatment cause a significant increase in the number of processes and an increase in process cost.

SUMMARY

An advantage of some aspects of the invention is that it provides a semiconductor device manufactured by using an organic semiconductor, a method of manufacturing the semiconductor device, and an electronic apparatus.

According to an aspect of the invention, there is provided a semiconductor device including: a substrate; a first electrode and a second electrode, each being formed on the substrate; a first region that is positioned between the first electrode and the second electrode; a second region that is connected with the first region; an organic semiconductor layer that is provided in the first region and in the second region; and a receptor of the organic semiconductor layer, the receptor being provided so as to surround the second region and having an opening that extends from the second region to the first region.

By virtue of this advantage, the organic semiconductor layer extends from the first region to the second region through the opening, and therefore liquid is supplied to the second region with the result that the liquid can be spread from the second region to wet the first region. Accordingly, the desired amount of the liquid can be supplied to the first region, and therefore an organic semiconductor layer having a fine (highly precise) structure can be provided. Furthermore, liquid is supplied to the first region through the second region, so that the liquid can be prevented from overflowing from the first region, thereby being able to prevent generation of a leak current. Moreover, even if a variation is generated in a position (ejection position) to which liquid is supplied, the liquid is caught by the second region, and therefore the liquid can be prevented from overflowing from the second region to the outside.

In the semiconductor device having the above advantage, it is preferable that a conductive material is used to form the receptor.

By virtue of this advantage, the conductive material is used to form the receptor, and therefore the same material as used for an electrode or a wire can be used to form the receptor. Accordingly, the receptor can be formed without separately preparing a material.

In the semiconductor device having any of the above advantages, it is preferable that the receptor is formed in at least one of the first electrode and the second electrode.

By virtue of this advantage, the receptor is formed in the first electrode or the second electrode, so that usage of an additional material to form the receptor can be precluded. Accordingly, required production costs can be reduced.

In the semiconductor device having any of the above advantages, it is preferable that an insulator is provided at least on the upper surface of the receptor.

By virtue of this advantage, an insulator is formed on the upper surface of the receptor, so that liquid to be used to form the organic semiconductor layer can be transferred along the insulator. Therefore, the liquid can be spread from the second region to wet the first region.

In the semiconductor device having any of the above advantages, it is preferable that liquid repellent treatment is applied at least on the upper surface of the receptor.

By virtue of this advantage, the liquid repellent treatment is applied on the upper surface of the receptor. Therefore in the case where liquid to be used to form the organic semiconductor layer is provided, the liquid can be prevented from overflowing to the periphery of the receptor. Accordingly, the desired liquid can be spread from the receptor to the first region.

In the semiconductor device having any of the above advantages, it is preferable that the receptor is divided into a plurality of segments.

By virtue of this advantage, the receptor is formed so as to be divided, and therefore the electric capacitance of each of the segments which functions as the receptor can be reduced.

According to another aspect of the invention, there is provided a method of manufacturing a semiconductor device having an organic semiconductor layer that is provided in a first region that is positioned between a first electrode and a second electrode which are each formed on the substrate, the method including: a receptor-forming process to form a receptor having an opening through which the first region is connected with a second region that is provided in the vicinity of the first region; and an application process to apply liquid containing an organic semiconductor material to the second region.

By virtue of this advantage, the receptor is formed such that the first region is connected with the second region, and liquid is applied to the second region. Therefore, the liquid can be spread from the second region to wet the first region. Furthermore, the liquid spreads to the first region through the second region, and therefore the liquid can be prevented from overflowing from the first region, thereby being able to supply the desired amount of the liquid to the first region. Accordingly, an organic semiconductor layer having a fine (highly precise) structure can be formed. Furthermore, flow of a leak current, which results from overflow of the liquid to a region other than the first region, can be prevented. Moreover, even if a variation is generated in a position (ejection position) to which liquid is supplied, the liquid is caught by the second region, and therefore the liquid can be prevented from overflowing from the second region to the outside.

In the above advantageous method of manufacturing the semiconductor device, it is preferable that a flow process is performed in which the liquid is made to flow from the second region to the first region after the application process.

By virtue of this advantage, the liquid spreads to the first region through the second region, so that the liquid can be prevented from overflowing from the first region as compared with the case in which a large amount of the liquid is directly supplied to the first region having a fine structure, for example. Accordingly, flow of a leak current due to overflow of liquid can be prevented. Moreover, even if a variation is generated in a position (ejection position) to which liquid is supplied, the liquid is caught by the second region, and therefore the desired amount of the liquid can be spread to the first region.

In any of the above advantageous methods of manufacturing the semiconductor device, it is preferable that the size of the second region is adjusted in the receptor-forming process in accordance with an amount of the liquid that is made to flow from the second region to the first region.

By virtue of this advantage, an amount of the liquid which spreads to wet the first region is adjusted depending on the size of the second region of the receptor, and therefore an organic semiconductor layer having a desired size can be formed in the first region. Furthermore a variation in the size of the organic semiconductor layer can be reduced, so that the organic semiconductor layer can be precisely manufactured.

In any of the above advantageous methods of manufacturing the semiconductor device, it is preferable that the receptor is provided for at least one of the first electrode and the second electrode in the receptor-forming process.

By virtue of this advantage, the first electrode or the second electrode is provided with the receptor, so that usage of an additional material to form the receptor can be precluded. Accordingly, required production costs can be reduced.

In any of the above advantageous methods of manufacturing the semiconductor device, it is preferable that the receptor is formed in the receptor-forming process by using a material that is the same as a material of at least one of the first electrode and the second electrode.

By virtue of this advantage, the receptor is formed using the same material as used for the first electrode or the second electrode, so that usage of an additional material to form the receptor can be precluded. Accordingly, required production costs can be reduced.

In any of the above advantageous methods of manufacturing the semiconductor device, it is preferable that an insulator-forming process is performed after the receptor-forming process to form an insulator at least on the upper surface of the receptor.

By virtue of this advantage, the insulator is formed on the upper surface of the receptor, and therefore liquid that is applied to the second region can be transferred along the insulator. Accordingly, the liquid can be spread from the second region to wet the first region, the second region forming the receptor. In addition, the liquid can be prevented from overflowing from the receptor to the outside.

In any of the above advantageous methods of manufacturing the semiconductor device, it is preferable that a resist film is left on the upper surface of the receptor, the resist film being used in the formation of the receptor in the receptor-forming process.

By virtue of this advantage, the resist film is left on the upper surface of the receptor, and therefore liquid that is applied onto the second region can be transferred along the resist film. Accordingly, the liquid can be spread from the second region to wet the first region, the second region forming the receptor. In addition, the liquid can be prevented from overflowing from the receptor to the outside.

In any of the above advantageous methods of manufacturing the semiconductor device, it is preferable that liquid repellent treatment is applied at least on the upper surface of the receptor.

By virtue of this advantage, the liquid repellent treatment is applied on the upper surface of the receptor, and therefore the liquid can be prevented from overflowing to the periphery of the receptor in the case where the liquid is applied to the second region. Accordingly, a desired liquid can be spread from the receptor to the first region.

In any of the above advantageous methods of manufacturing the semiconductor device, it is preferable that an insulating material is used to form the receptor in the receptor-forming process.

By virtue of this advantage, an insulating material is used to form the receptor, and therefore even if the receptor is formed so as to contact the first region and the second region, such a configuration does not have any influence on electrical properties. Accordingly, the liquid can be supplied to the first region through the receptor.

According to another aspect of the invention, there is provided an electronic apparatus including the semiconductor device having any of the above advantages.

By virtue of this advantage, an electronic apparatus that enables electric properties to be enhanced and that enables display quality to be improved can be provided, for example.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
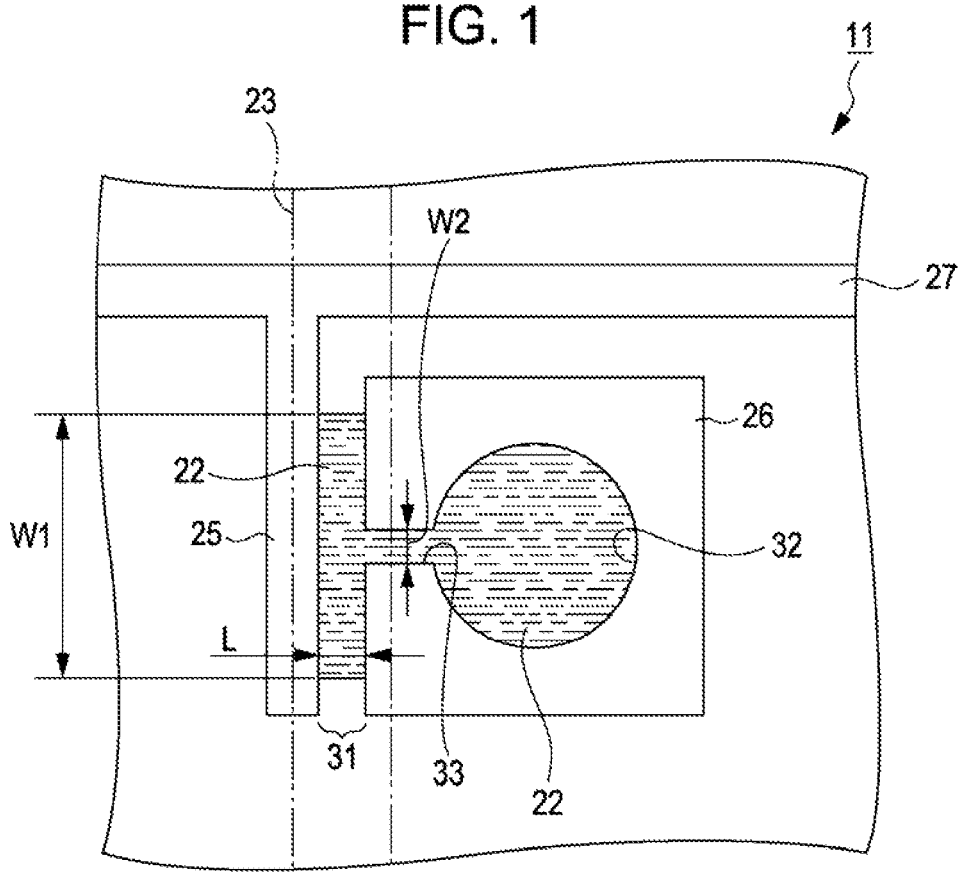
FIG. 1 is a plan view schematically illustrating the configuration of a semiconductor device.

Embodiments of the invention will be hereinafter described with reference to the accompanying drawings. In the drawings, in order to visibly recognize components to be described, the size of each component is appropriately increased or decreased. The description will be made in accordance with the case in which a semiconductor device is applied to a display device.

Configuration of Semiconductor Device

Figure 2:
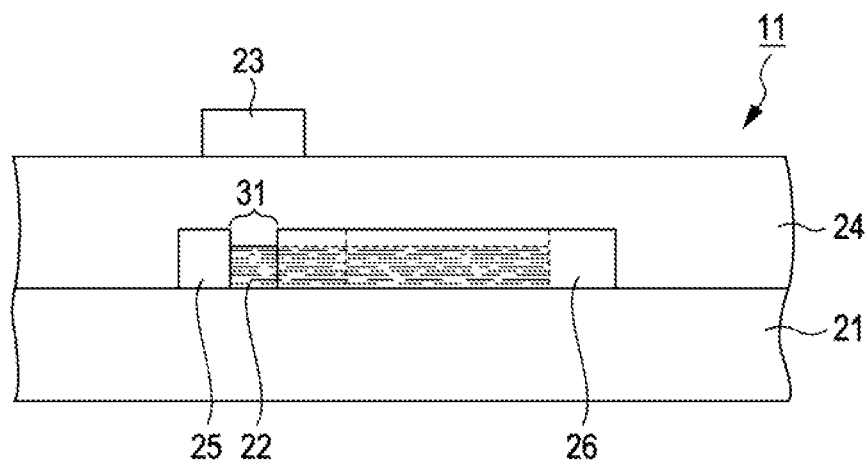
FIG. 2 is a lateral view schematically illustrating the semiconductor device in FIG. 1.

FIG. 1 is a plan view schematically illustrating the configuration of a semiconductor device. FIG. 2 is a lateral view schematically illustrating the semiconductor device in FIG. 1. The configuration of the semiconductor device will be hereinafter described with reference to FIGS. 1 and 2. In the semiconductor device illustrated in FIG. 1, illustration of a gate electrode and gate insulator is omitted.

With reference to FIGS. 1 and 2, a semiconductor device 11 is configured so as to have, for example, a top gate structure and includes a semiconductor layer 22 that is formed as an organic semiconductor layer provided on a substrate 21, a gate electrode 23 that is formed so as to face the semiconductor layer 22, a gate insulator 24 that isolates the semiconductor layer 22 from the gate electrode 23, a source electrode 25 that is formed so as to overlap the gate electrode 23 and that functions as a first electrode, and a drain electrode 26 that functions as a second electrode. The source electrode 25 is connected to a data line 27.

For example, the substrate 21 is formed as a plastic substrate. A thermoplastic resin or thermosetting resin may be used as a plastic substrate material. Examples of such a material include polyolefins such as polyethylene, polypropylene, ethylene-propylene copolymer, and ethylene-vinyl acetate copolymer (EVA); cyclic polyolefin; modified polyolefin; polyvinyl chloride; polyvinylidene chloride; polystyrene; polyamide; polyimide; polyamideimide; polycarbonate; poly-(4-methylpentene-1); ionomer; acrylate resin; polymethylmethacrylate; acrylic-styrene copolymers (AS resin); butadiene-styrene copolymers; ethylene-vinyl alcohol copolymers (EVOH); polyesters such as polyethylene terephthalate, polybutylene terephthalate, polyethylene naphthalate, and polycyclohexane terephthalate (PCT); polyether; polyether ketone; polyether ether ketone; polyether imide; polyacetal; polyphenylene oxide; modified polyphenylene oxide; polyarylate; aromatic polyether (liquid crystal polymers); polytetrafluoroethylene; polyvinylidene fluoride; other fluororesins; various thermoplastic elastomers such as styrene, polyolefin, polyvinyl chloride, polyurethane, fluororubber, and chlorinated polyethylene type thermoplastic elastomers; epoxy resin; phenolic resin; urea resin; melamine resin; unsaturated polyester; silicone resin; polyurethane; and copolymers, blends, and polymer alloys mainly containing the foregoing materials. The substrate 21 may be a single layer containing one of these materials or a laminate containing two or more of these materials.

Examples of a material used for the organic semiconductor layer 22 include organic semiconductor materials with high molecular weights, such as poly-N-vinylcarbazole, polyvinylpyrene, polyvinylanthracene, polythiophene, polyhexylthiophene, poly(p-phenylenevinylene), polythienylenevinylene, polyarylamine, pyrene-formaldehyde resin, ethylcarbazole-formaldehyde resin, fluorene-bithiophene copolymers, fluorene-arylamine copolymers, and derivatives thereof and include organic semiconductor materials with low molecular weights, such as naphthalene, anthracene, tetracene, pentacene, hexacene, phthalocyanine, perylene, hydrazone, triphenylmethane, diphenylmethane, stilbene, arylvinyl, pyrazoline, triphenylamine, triarylamine, oligothiophene, phthalocyanine, and derivatives thereof. These materials can be used alone or in combinations of two or more.

Examples of a solvent used for the organic semiconductor layer 22 include toluene, tetrahydrofuran, xylene, mesitylene, tetralin, monochlorobenzene, and dichlorobenzene.

The source electrode 25 and the drain electrode 26 are formed on the substrate 21 as described above. Examples of materials of the source electrode 25 and drain electrode 26 include chromium (Cr), aluminum (Al), tungsten (W), molybdenum (Mo), niobium (Nb), copper (Cu), silver (Ag), gold (Au), platinum (Pt), palladium (Pd), indium (In), nickel (Ni), neodymium (Nd), and an alloy thereof. Each of the source electrode 25 and the drain electrode 26 has a thickness that is approximately in the range from 50 nm to 1 μm, for example.

The gate insulator 24 is provided so as to cover the semiconductor layer 22. The material used for the gate insulator 24 is not specifically limited as long as the gate insulator 24 is made of a material having insulation properties. Both an organic material and an inorganic material may be used, and an organic insulator generally has a tendency to form a good interface with an organic semiconductor layer, and therefore the organic insulating material is preferably employed. Examples of a material which generally imparts good electric properties to the gate insulator 24 include films of polyvinyl alcohol, polyethylene, polypropylene, polybutylene, polystyrene, polymethylmethacrylate, polymide, polyvinylphenol, polycarbonate, and parylene. These materials may be used alone or in combinations of two or more.

The gate electrode 23 (scanning line) is formed on the gate insulator 24. The gate electrode 23 is formed so as to overlie the source electrode 25 and the drain electrode 26 with the gate insulator 24 interposed between the gate electrode 23 and each of the source electrode 25 and the drain electrode 26. Examples of the material used for the gate electrode 23 include Cr, Al, W, Mo, Nb, Cu, Ag, Au, Pt, Pd, In, Ni, Nd, and an alloy thereof. The gate electrode 23 has a thickness that is approximately in the range from 50 μm to 100 μm, for example.

The drain electrode 26 has a receiving section 32 as a second region that is connected with a channel region 31 that serves as a first region in which the gate electrode 23 covers the semiconductor layer 22 in plan view. The channel region 31 is connected with the receiving section 32 through an opening 33.

Liquid that contains an organic semiconductor material to be used to form the semiconductor layer 22 is supplied to the receiving section 32. In the embodiment, the drain electrode 26 having the receiving section 32 serves as a receptor that receives liquid. The drain electrode 26, which has a substantially square shape, is partially etched to be removed, and the receiving section 32 is thus formed. Liquid is supplied (ejected, for example) to the receiving section 32, and then the liquid flows to the channel region 31 from the receiving section 32 through the opening 33.

Even if liquid (droplets) is supplied in a size larger than a channel length L, the receiving section 32 is configured so as to have an area that is sufficiently large to receive such liquid. The receiving section 32 contributes to preventing overflow of liquid from the channel region 31. The channel length L is set to be 10 μm, for example. A channel width W1 is set to be 500 μm, for example.

The area of the receiving section 32 is changed (adjusted), so that the amount of the liquid that flows to the channel region 31 can be adjusted. In other words, the channel width W1 can be adjusted. The opening 33 has a width W2 of approximately 10 μm, for example. The width W2 is preferably set so as not to suppress the flow of the liquid 35. A method of manufacturing the semiconductor device 11 will be described below.

Method of Manufacturing Semiconductor Device

FIGS. 3A to 6B schematically illustrate the method of manufacturing the semiconductor device 11 in process sequence. FIGS. 3A, 4A, 5A, and 6A are plan views each schematically illustrating the semiconductor device 11. FIGS. 3B, 4B, 5B, and 6B are lateral views each schematically illustrating the semiconductor device 11 in FIGS. 3A, 4A, 5A, and 6A, respectively. FIG. 7 is an exploded perspective view illustrating the configuration of an ejection head that is used in an ink jet technique. The method of manufacturing the semiconductor device 11 will be described below with reference to FIGS. 3A to 7.

Figure 3A:
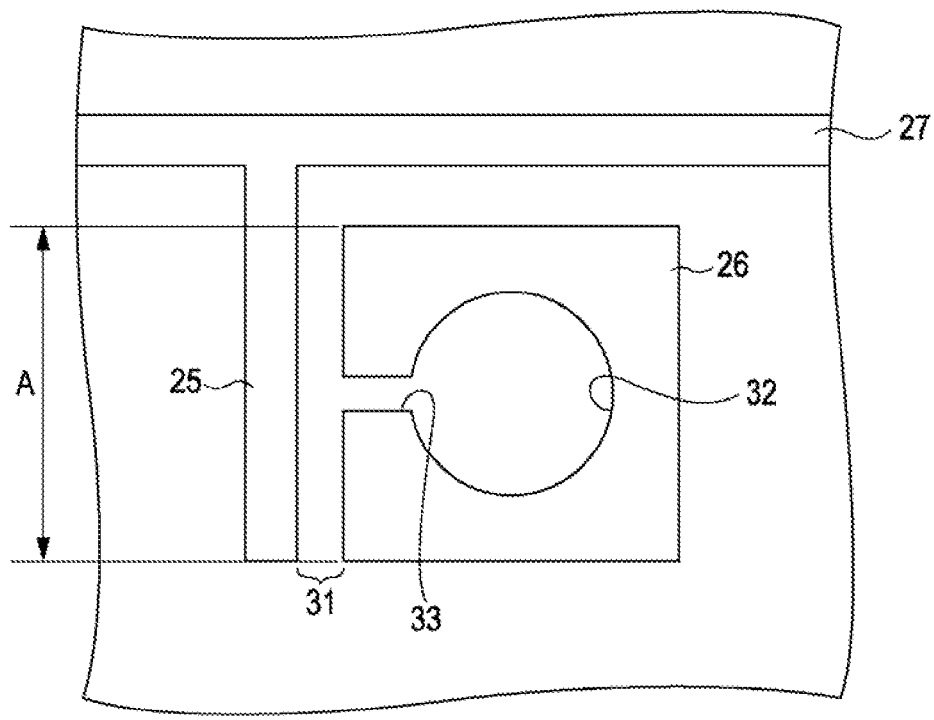
FIG. 3A is a plan view schematically illustrating a semiconductor device and illustrating a process of manufacturing the semiconductor device.
Figure 3B:
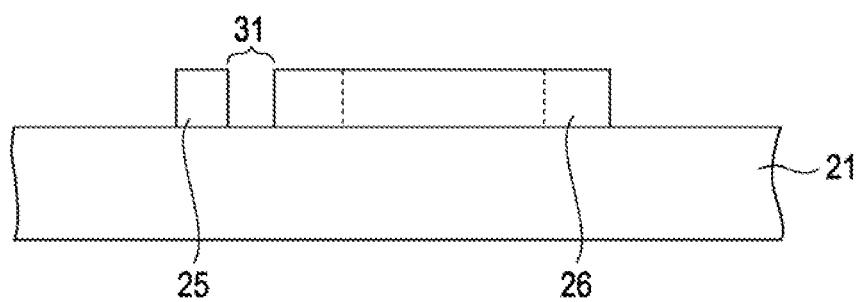
FIG. 3B is a lateral view schematically illustrating the semiconductor device in FIG. 3A.

First, the source electrode 25 and the drain electrode 26 are formed on the substrate 21 as illustrated in FIGS. 3A and 3B (receptor-forming process). Specifically, the drain electrode 26 is partially etched to be removed in a substantially circular shape and is thus formed as a receptor. Furthermore, the drain electrode 26 is formed so as to have the opening 33, and the opening 33 extends from the region (second region), which has been removed in a substantially circular shape, to a first region A (channel region 31) that is positioned between the drain electrode 26 and the source electrode 25 that is formed so as to face the drain electrode 26.

For example, the substrate 21 is formed as a plastic substrate. Examples of a technique that is employed to form the source electrode 25 and the drain electrode 26 include a vapor deposition method, a chemical vapor deposition (CVD) method, a sputtering method, a spin coat method, an ink jet technique, and a dispensing technique. Each of the source electrode 25 and the drain electrode 26 has a thickness that is approximately in the range from 50 nm to 1 μm, for example. However, each of the source electrode 25 and the drain electrode 26 may be formed so as to have a larger thickness to prevent overflow of the liquid to be used to form the semiconductor layer 22 from the receiving section 32 or the like.

In parallel with the formation of the source electrode 25, the data line 27 to be connected to the source electrode 25 is also formed. Furthermore, in parallel with the formation of the drain electrode 26, the receiving section 32 and the opening 33 are formed, each being a region to which an electrode material is not applied. For example, Au is used to form the source electrode 25 and the drain electrode 26.

In the embodiment, for example, a photolithographic technique is used to form each of the source electrode 25 and the drain electrode 26 in a predetermined shape. Owing to this process, the source electrode 25 and the drain electrode 26, which has the receiving section 32 and the opening 33, can be patterned in a highly precise manner, and therefore the semiconductor layer 22 to be formed between the source electrode 25 and the drain electrode 26 can be also formed in a highly precise manner.

Figure 4A:
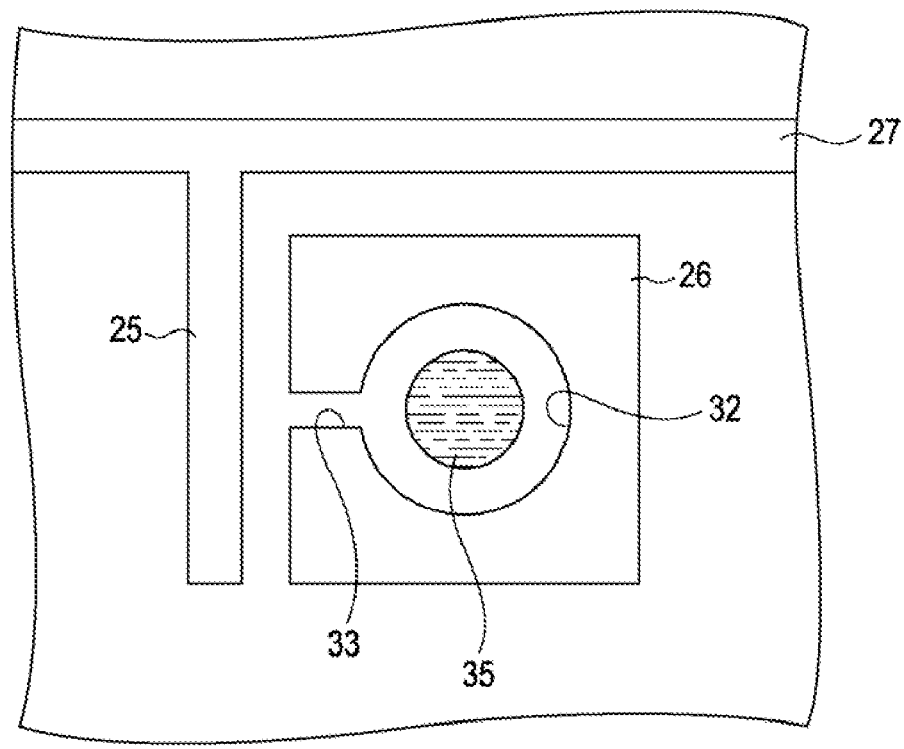
FIG. 4A is a plan view schematically illustrating the semiconductor device and illustrating another process of manufacturing the semiconductor device.
Figure 4B:
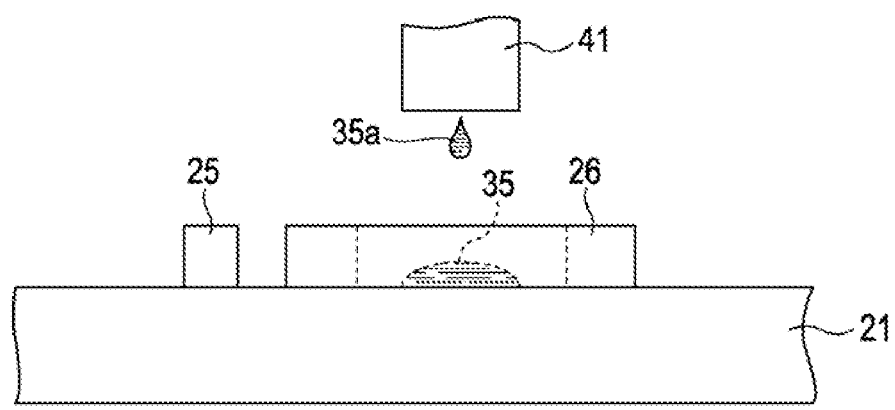
FIG. 4B is a lateral view schematically illustrating the semiconductor device in FIG. 4A.

Subsequently, the droplet 35a to be formed into the semiconductor layer 22 is ejected onto the receiving section 32 (application process) as illustrated in FIGS. 4A and 4B. Specifically, the droplet 35a is ejected by an ink jet technique utilizing an ejection head 41 (see, FIG. 7). The configuration of the ejection head 41 will be described below with reference to FIG. 7.

With reference to FIG. 7, the ejection head 41 has a substrate 42 and an elastic plate 43 that is disposed on the substrate 42, and piezoelectric devices 44 are formed on the elastic plate 43. Each of the piezoelectric devices 44 has a structure in which a lower electrode 44a, a piezoelectric film 44b, and an upper electrode 44c are stacked, and the upper electrode 44c is connected to a lead electrode 44d.

Openings 42a are formed in the substrate 42 so as to be positioned under the individual piezoelectric devices 44. The openings 42a function as pressure chambers. A nozzle plate 45 is disposed under the substrate 42 and has nozzle openings 45a that are formed so as to correspond to the respective pressure chambers. The piezoelectric devices 44 are actuated to deform the elastic plate 43, and then the liquid 35 that has been supplied to the pressure chambers is ejected from the nozzle openings 45a.

Figure 5A:
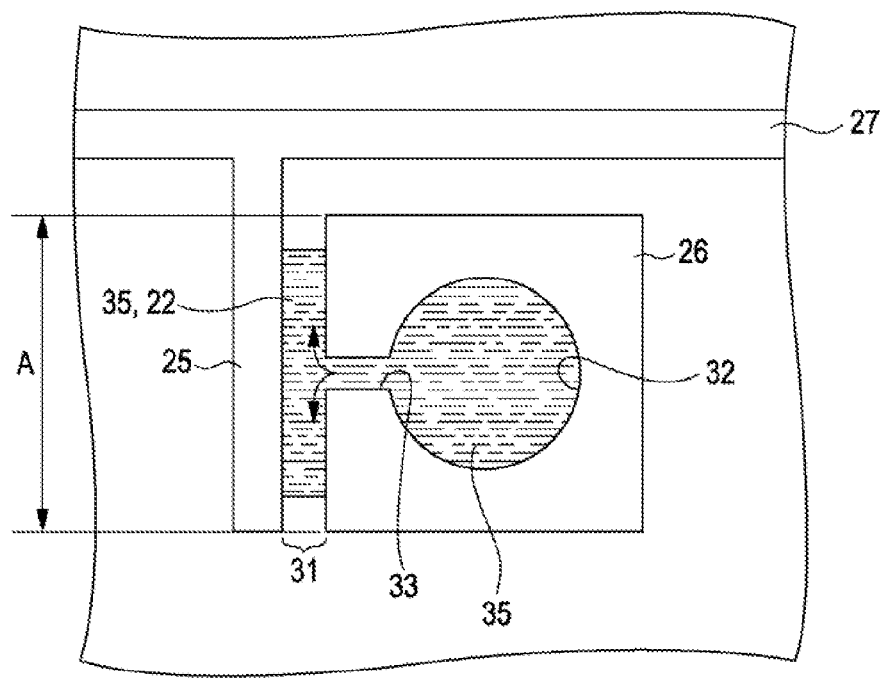
FIG. 5A is a plan view schematically illustrating the semiconductor device and illustrating another process of manufacturing the semiconductor device.
Figure 5B:
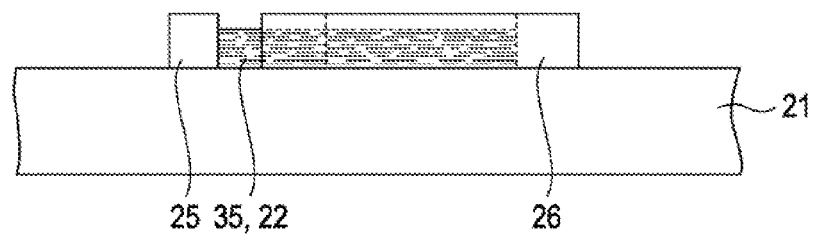
FIG. 5B is a lateral view schematically illustrating the semiconductor device in FIG. 5A.

As illustrated in FIGS. 5A and 5B, the droplet 35a ejected from the ejection head 41 spreads all over the receiving section 32, and then the liquid 35 partially flows to the channel region 31 through the opening 33 (flow process). After the spread of the liquid 35 has finished, the liquid 35 is dried and sintered (crystalized), thereby forming the organic semiconductor layer (semiconductor layer 22). The configuration of the semiconductor layer 22 is determined depending on the characteristics of the semiconductor device, and therefore the semiconductor layer 22 may be entirely formed in the longitudinal direction of the first region A or may be partially formed in such a direction.

As described above, the liquid 35 to be formed into the semiconductor layer 22 is ejected onto the receiving section 32 having an area larger than that of the channel region 31 (channel length L). Therefore, even in the case where the ejected droplet 35a has a landing diameter larger than the channel length L, the liquid 35 can be prevented from overflowing from the channel region 31. Furthermore, enhanced positional precision of ejection is not required, and therefore an ink jet apparatus that exhibits low positional precision of ejection can be appropriately used as a manufacturing apparatus.

Furthermore, the area of the receiving section 32 is changed, thereby changing the amount of liquid that flows into the channel region 31. Therefore, the landing diameter of the droplet 35a is not required to be reduced, in other words, the amount of the droplet 35a is not required to be controlled in a highly precise manner to fall below a predetermined level. Namely, the area of the receiving section 32 is changed, thereby changing the channel width W1 (see, FIG. 1). For example, in the case where a certain amount of the liquid 35 is ejected, the area of the receiving section 32 is reduced to increase the channel width W1, and the area of the receiving section 32 is increased to reduce the channel width W1.

Figure 6A:
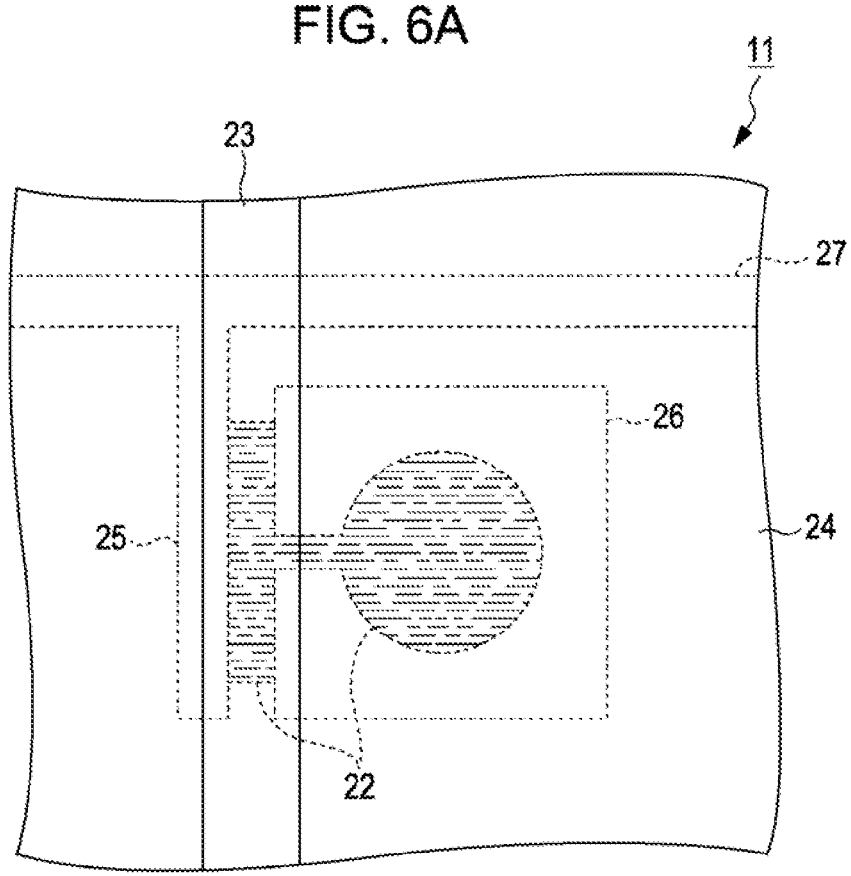
FIG. 6A is a plan view schematically illustrating the semiconductor device and illustrating another process of manufacturing the semiconductor device.
Figure 6B:
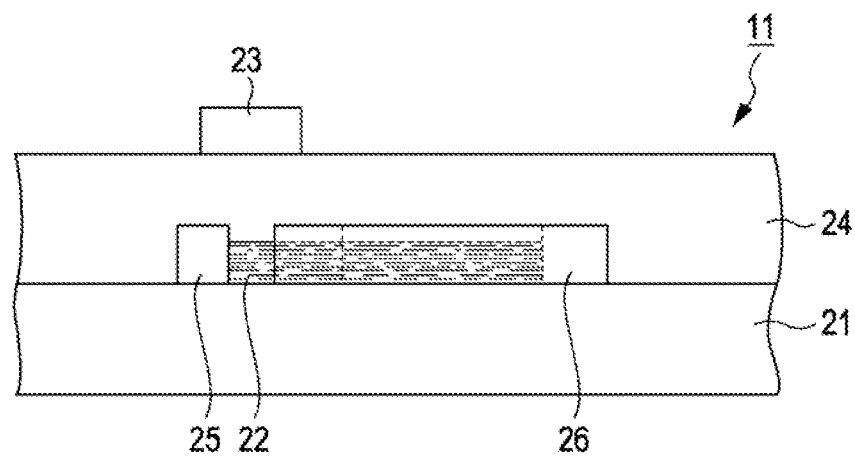
FIG. 6B is a lateral view schematically illustrating the semiconductor device in FIG. 6A.
Figure 7:
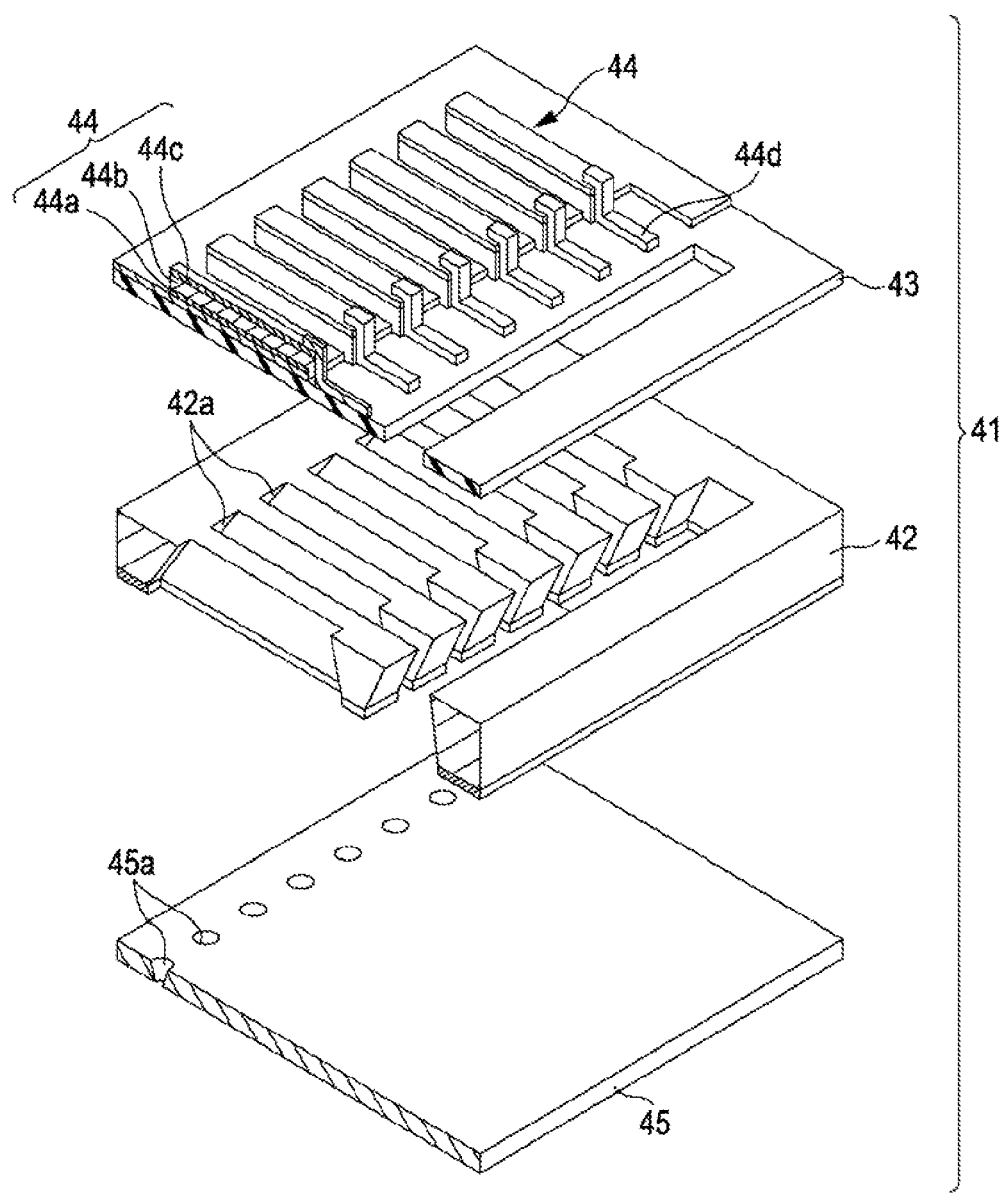
FIG. 7 is an exploded perspective view illustrating the configuration of an ejection head.

Subsequently, the gate electrode 23 is formed so as to overlie the semiconductor layer 22 as illustrated in FIGS. 6A and 6B. Specifically, the gate insulator 24 is formed on the semiconductor layer 22, and the gate electrode 23 is formed on the gate insulator 24. In the case where an insulator is formed on an organic semiconductor layer, an organic insulating material is preferably used. In the case where an inorganic insulating material such as silicon oxide is used, the inside of the organic semiconductor layer, which is provided as a lower layer, is often damaged resulting from heat at the time of deposition or resulting from deposited particles and film stress during the deposition, and therefore an organic material is preferably employed.

For example, the gate insulator 24 is formed as follows: dissolving or dispersing the above material used for the gate insulator 24 into a solvent; then applying the resultant liquid onto the substrate 21 by using a spin coat method; and then imparting rigidity to the resultant product.

Subsequently, the gate electrode 23 (scanning line) is formed on the gate insulator 24. Specifically, the gate electrode 23 is formed so as to overlie a region (namely, the channel region 31) between the source electrode 25 and the drain electrode 26 with the gate insulator 24 interposed between the gate electrode 23 and such a region. The same material and manufacturing method as used for the source electrode 25 and drain electrode 26 are employed, thereby enabling formation of the gate electrode 23. Through these processes, the manufacturing of the semiconductor device 11 having the organic semiconductor layer is completed.

Configuration of Electronic Apparatus

Figure 8:
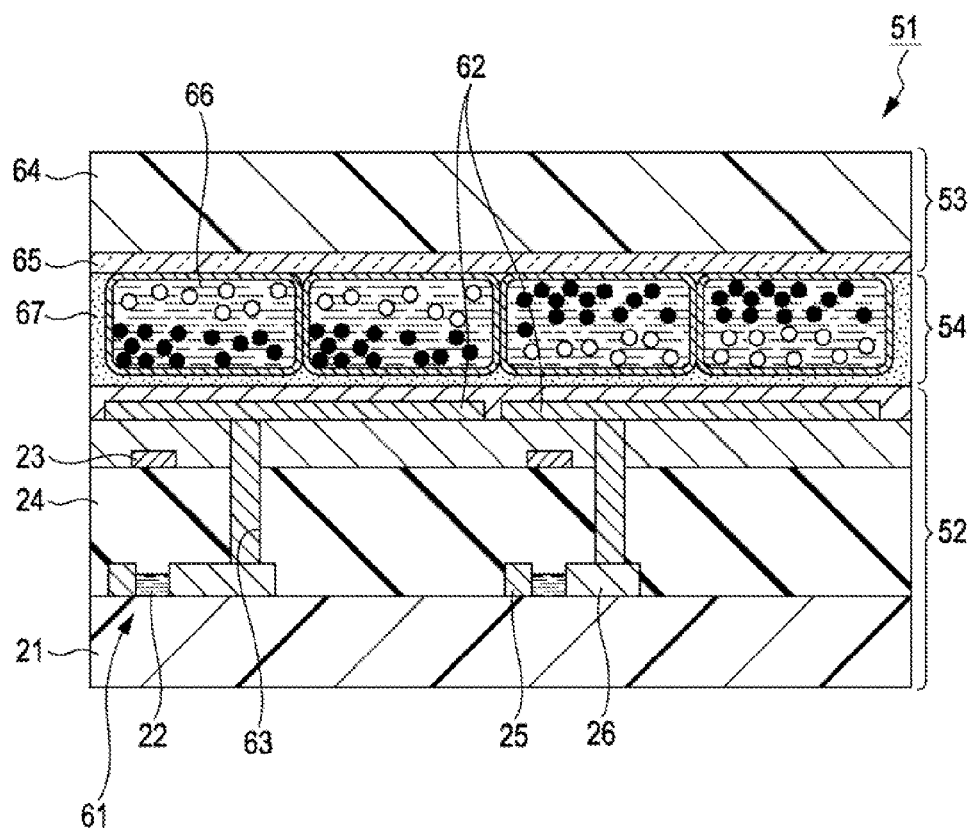
FIG. 8 is a cross-sectional view schematically illustrating the configuration of an electrophoretic display device including the semiconductor device.
Figure 9:
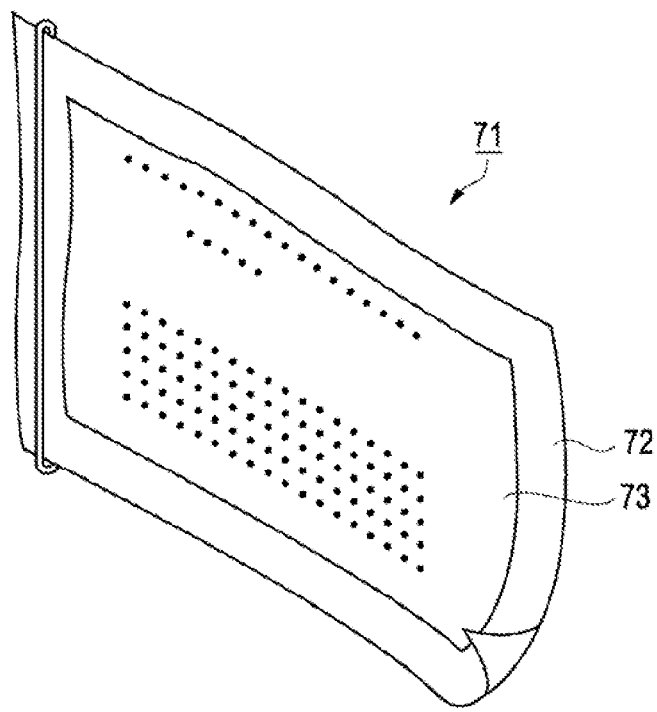
FIG. 9 is a perspective view schematically illustrating the configuration of electronic paper as an example of an electronic apparatus including the electrophoretic display device.

FIG. 8 is a cross-sectional view schematically illustrating the configuration of an electrophoretic display device including the above semiconductor device. FIG. 9 is a perspective view schematically illustrating the configuration of electronic paper as an example of an electronic apparatus including the electrophoretic display device. The configuration of the electrophoretic display device including the semiconductor device and the configuration of the electronic paper will be hereinafter described with reference to FIGS. 8 and 9, respectively.

With reference to FIG. 8, an electrophoretic display device 51 has a device substrate 52, a counter substrate 53, and an electrophoretic layer 54.

The device substrate 52 includes the substrate 21, switching devices 61 that are provided on the substrate 21, and pixel electrodes 62. Specifically, the substrate 21 is formed as a plastic substrate (resin substrate) as described above, for example.

Each of the switching devices 61 includes the source electrode 25, the semiconductor layer 22, the drain electrode 26, and the gate electrode 23 that is disposed so as to face the semiconductor layer 22 with the gate insulator 24 interposed therebetween. Each of the pixel electrodes 62 is made of, for example, indium tin oxide (ITO) or the like and is electrically connected to the drain electrode 26 through a contact hole 63.

The counter substrate 53 includes a substrate 64 and a common electrode 65. The substrate 64 is made of, for example, the same material as the substrate 21. The common electrode 65 is configured as a thin-film electrode that is provided almost entirely on a surface of the substrate 64, the surface facing the inside of the electrophoretic display device 51. The common electrode 65 is made of, for example, a conductive material having high optical transparency, such as ITO.

The electrophoretic layer 54 is disposed between the pixel electrodes 62 of the device substrate 52 and the common electrode 65 of the counter substrate 53 and includes a plurality of microcapsules 66 and a binder 67.

Each of the microcapsules 66 has a substantially spherical shape, and an electrophoretic dispersion liquid is encapsulated in each of the microcapsules 66. The microcapsules 66 have diameters that are substantially equal to each other. Each of the microcapsules 66 contains two types of electrophoretic particles including, for example, titanium dioxide as a white pigment and carbon black as a black pigment. One type of the particles is negatively charged, and the other type of the particles is positively charged.

The particles move in response to the amount of charge that has flowed. Namely, brightness is adjusted in accordance with the amount of current. The binder 67 serves as a fixing member that fixes the microcapsules 66 especially to the counter substrate 53.

Electronic paper 71 illustrated in FIG. 9 includes a body 72 and a display unit 73, the body 72 being formed with a rewritable sheet having a texture and a flexibility the same as those of paper. The electrophoretic display device 51 can be employed as the display unit 73 and can be incorporated in the electronic paper 71.

The embodiment which has been described above in detail can provide the following advantages.

First Advantage

Owing to the configuration of the embodiment, the drain electrode 26 has the opening 33 that is in communication with the channel region 31 and has the receiving section 32, and the droplet 35a is ejected onto the receiving section 32, and therefore the liquid 35 (droplet 35a) can be spread from the receiving section 32 to wet the channel region 31. Accordingly, for example, even if the droplet 35a having a size larger than the channel length L is ejected, the liquid 35 is spread to wet the channel region 31 through the receiving section 32, so that the liquid 35 can be prevented from overflowing from the channel region 31. Consequently, the semiconductor layer 22 having a fine structure can be formed. Furthermore, the liquid 35 does not overflow from the channel region 31, so that flow of a leak current can be prevented, the leak current being generated during the overflow of the liquid 35.

Second Advantage

Owing to the configuration of the embodiment, an amount of the liquid 35 that is spread to wet the channel region 31 is adjusted in accordance with the size (area) of the receiving section 32, and therefore the semiconductor layer 22 can be formed in the channel region 31 so as to have a desired size (area). Furthermore, a variation in the size of the semiconductor layer 22 can be reduced, thereby being able to form the semiconductor layer 22 in a highly precise manner.

Third Advantage

Owing to the configuration of the embodiment, the receiving section 32 is configured so as to have a size larger than that of the droplet 35a, and therefore the droplet 35a can be prevented from being ejected onto the outside of the receiving section 32 even if the ejection head 41 has a variation in the ejection position of the droplet 35a.

Embodiments of the invention are not limited to the above embodiment, and the following modifications can be employed.

First Modification

Figure 10:
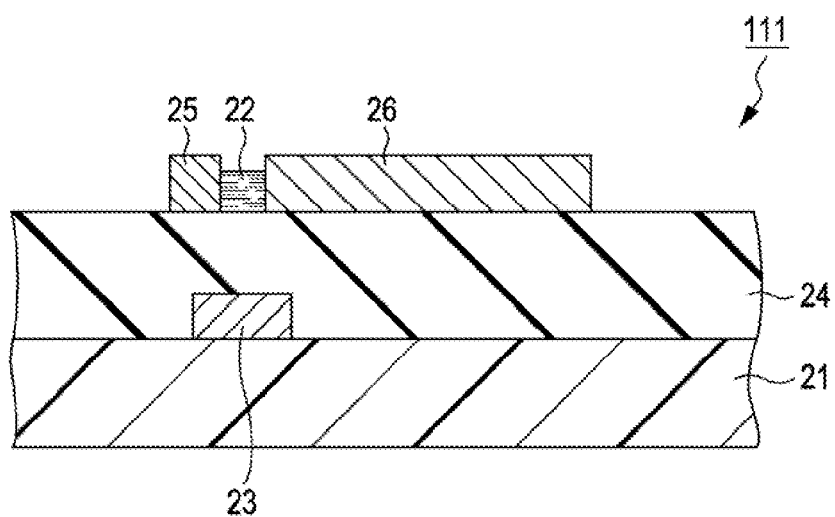
FIG. 10 is a cross-sectional view schematically illustrating the configuration of a modification of the semiconductor device.

The configuration of the semiconductor device 11 is not limited to the top gate structure as described above, a bottom gate structure may be employed as illustrated in FIG. 10. In a semiconductor device 111 having the bottom gate structure, the gate electrode 23 is formed on the substrate 21, and the gate insulator 24 is formed on the gate electrode 23 and the substrate 21. Furthermore, the source electrode 25, the semiconductor layer 22, and the drain electrode 26 are formed on the gate insulator 24. Owing to such a configuration, the structure different from the top gate structure is provided, while being able to be formed by using the same method as used in the embodiment.

Second Modification

The shapes of the source electrode 25, drain electrode 26, and receiving section 32 are not limited to those in the above embodiment, and the shapes illustrated in FIGS. 11 to 20 may be employed, for example. Semiconductor devices 211a to 211j respectively illustrated in FIGS. 11 to 20 have, for example, top gate structures, and illustration of the gate insulator 24 and gate electrode 23 is omitted in the drawings.

Figure 11:
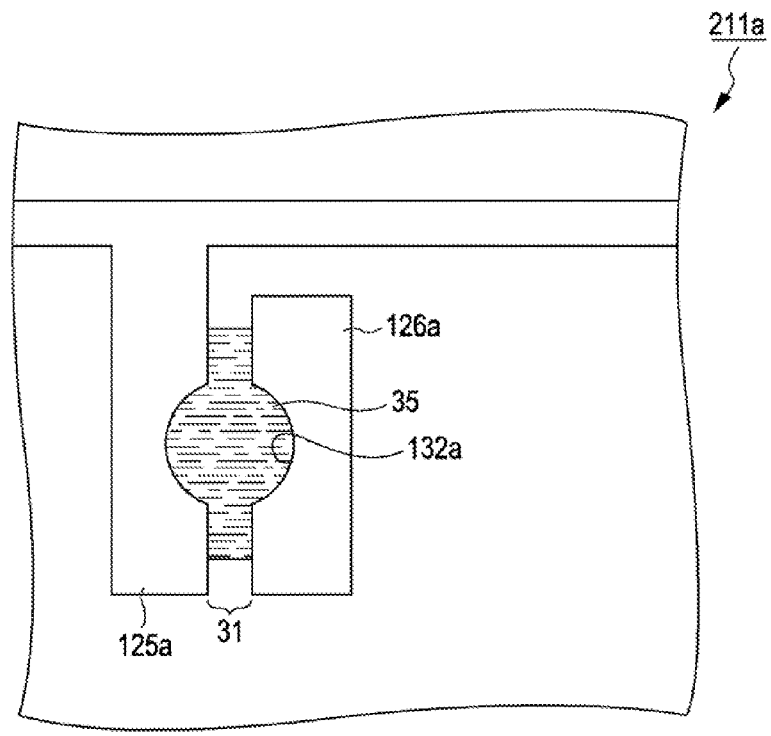
FIG. 11 is a plan view schematically illustrating the configuration of another modification of the semiconductor device.

In the semiconductor device 211a illustrated in FIG. 11, a receiving section 132a is formed so as to include a region that is positioned between the source electrode 125a and the drain electrode 126a and that overlaps the channel region 31 in plan view. The liquid 35 that is ejected from the ejection head 41 is spread to wet the receiving section 132a and the channel region 31. By virtue of this configuration, as compared with the case in which the receiving section 132a is formed only in the drain electrode 126a, the area of the drain electrode 126a can be decreased. Meanwhile, the receiving section 132a may be configured so as to be formed only in the source electrode 125a.

Figure 12:
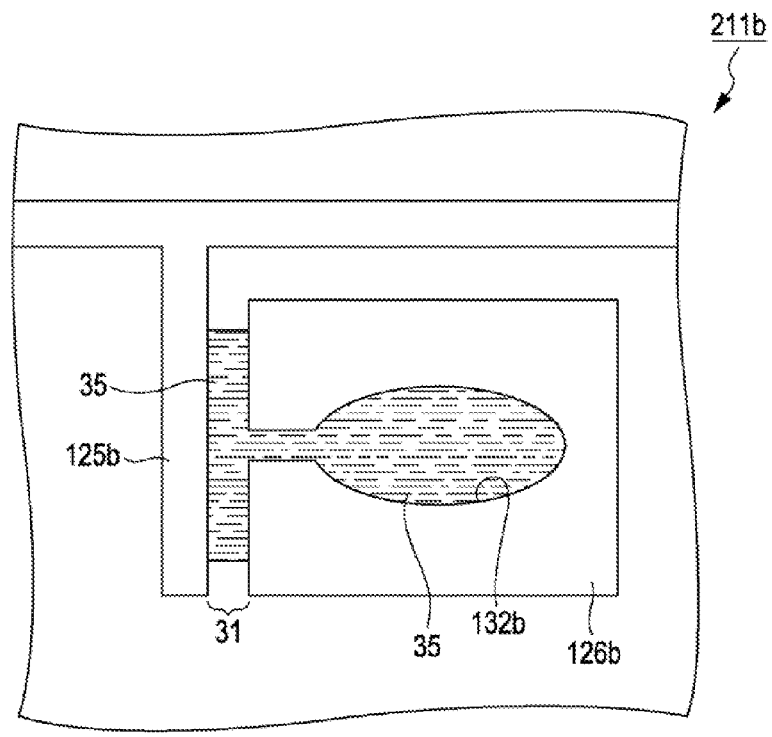
FIG. 12 is a plan view schematically illustrating the configuration of another modification of the semiconductor device.

In a semiconductor device 211b illustrated in FIG. 12, a receiving section 132b that is formed in a drain electrode 126b does not have a circular shape but have an elliptical shape. The shape of the receiving section 132b is not limited to the elliptical shape, and the receiving section 132b may be configured so as to have a square shape. This configuration can take care of ease of flow of liquid, a direction of a variation in the ejection position of the droplet 35a, or the like.

Figure 13:
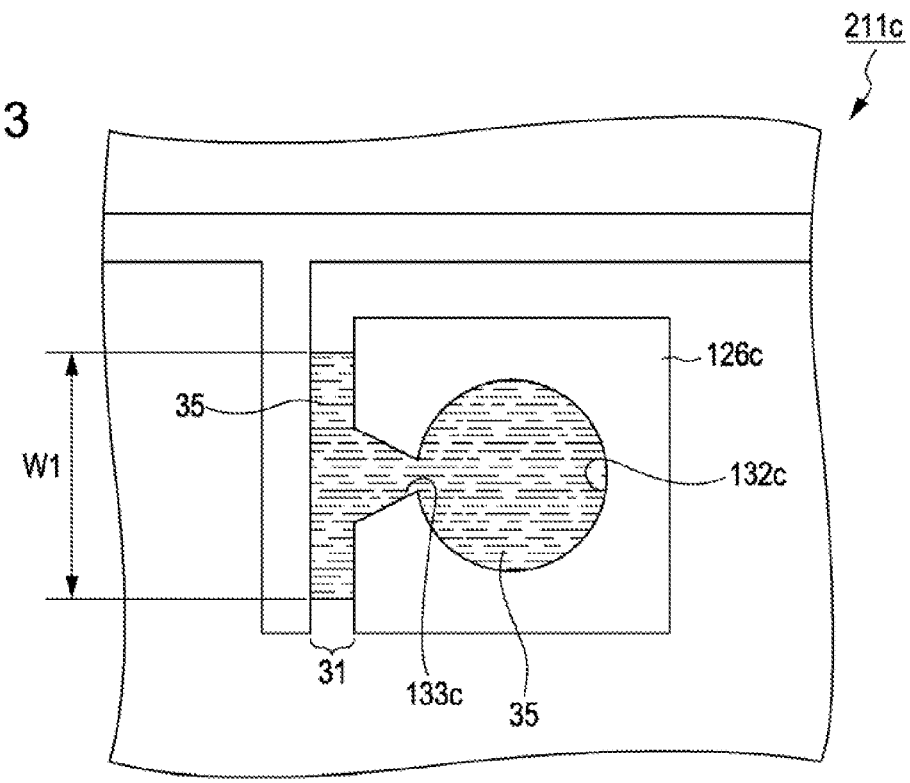
FIG. 13 is a plan view schematically illustrating the configuration of another modification of the semiconductor device.

In a semiconductor device 211c illustrated in FIG. 13, an opening 133c that extends from a receiving section 132c to the channel region 31 is configured so as to have a shape different from that in the embodiment. Specifically, the width of the opening 133c is configured so as to be increased as the opening 133c extends from the receiving section 132c to the channel region 31. By virtue of this configuration, the liquid 35 can be uniformly spread to wet the both sides of the channel width W1, for example.

Figure 14:
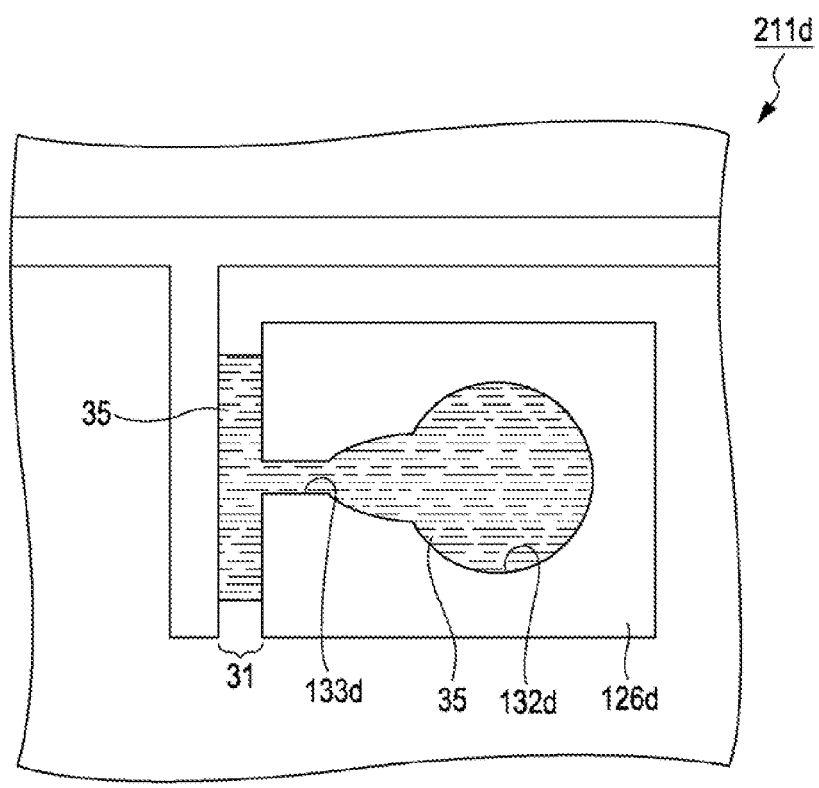
FIG. 14 is a plan view schematically illustrating the configuration of another modification of the semiconductor device.

In the semiconductor device 211d illustrated in FIG. 14, an opening 133d that extends from a receiving section 132d to the channel region 31 gradually narrows. By virtue of this configuration, the flowability of the liquid 35 that flows from the receiving section 132d to the channel region 31 can be enhanced.

Figure 15:
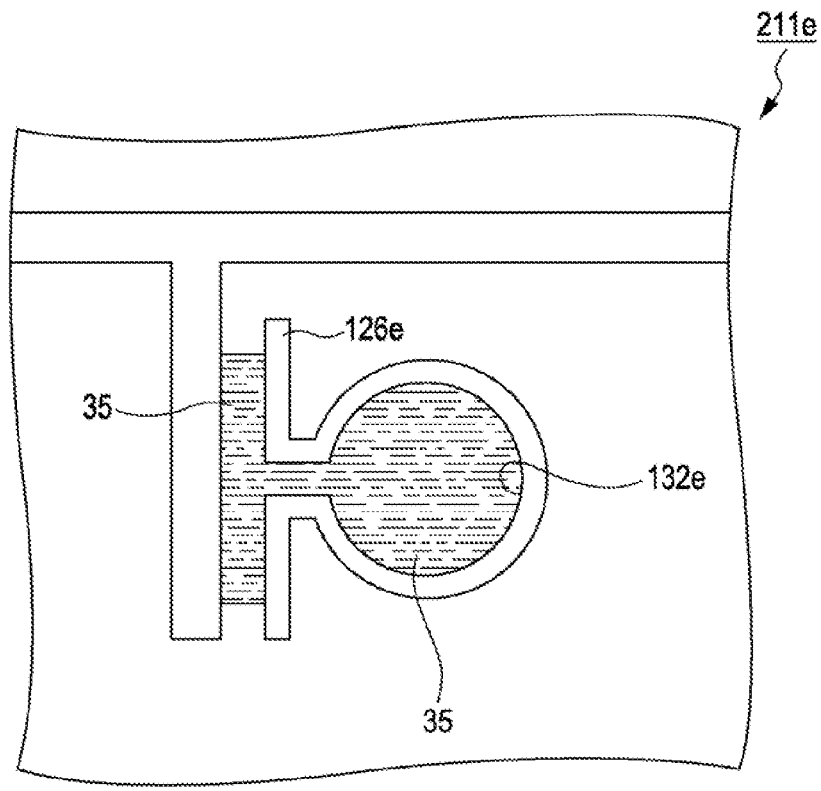
FIG. 15 is a plan view schematically illustrating the configuration of another modification of the semiconductor device.

In the semiconductor device 211e illustrated in FIG. 15, a drain electrode 126e is linearly formed so as to surround a receiving section 132e. By virtue of this configuration, the drain electrode 126e can be formed so as not to have an unnecessarily increased size.

Figure 16:
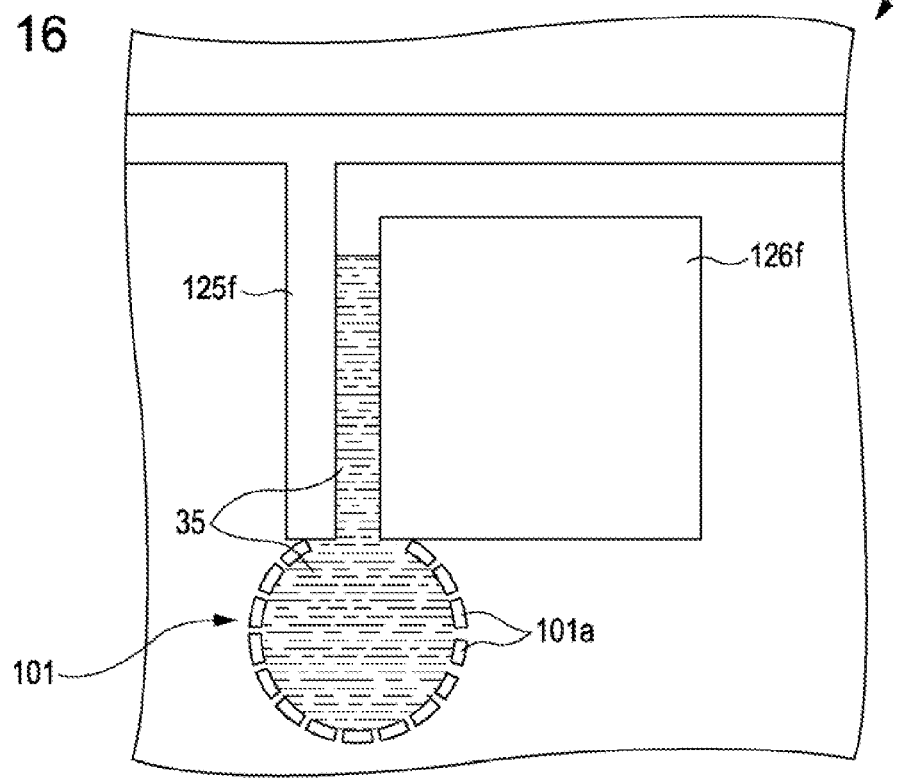
FIG. 16 is a plan view schematically illustrating the configuration of another modification of the semiconductor device.

In the semiconductor device 211f illustrated in FIG. 16, the receiving section is not formed in a source electrode 125f and in a drain electrode 126f. The receiving section is formed as a receptor 101 in a region adjacent to the source electrode 125f and the drain electrode 126f. The receptor 101 is divided into several pieces (divided structures 101a) by using insulators such that the source electrode 125f is not in electrical communication with the drain electrode 126f. Furthermore, in order to prevent the liquid 35 from leaking to the periphery of the receptor 101, a distance between the divided structures 101a is set to be, for example, less than or equal to 5 μm, the divided structures 101a forming the receptor 101. By virtue of this configuration, the liquid 35 can be transferred to the channel region 31 without forming the receiving section 32 in the source electrode 125f and in the drain electrode 126f.

If the receptor 101 does not contact the source electrode 125f and the drain electrode 126f, the receptor 101 may be formed by using a conductor. Furthermore, in the case where the receptor 101 is linearly formed so as to be connected with the source electrode 125f and the drain electrode 126f, the receptor 101 is preferably formed by using an insulator. Accordingly, even if the receptor 101 is configured so as to be connected with the source electrode 125f and the drain electrode 126f, such a configuration does not affect electrical properties.

Figure 17:
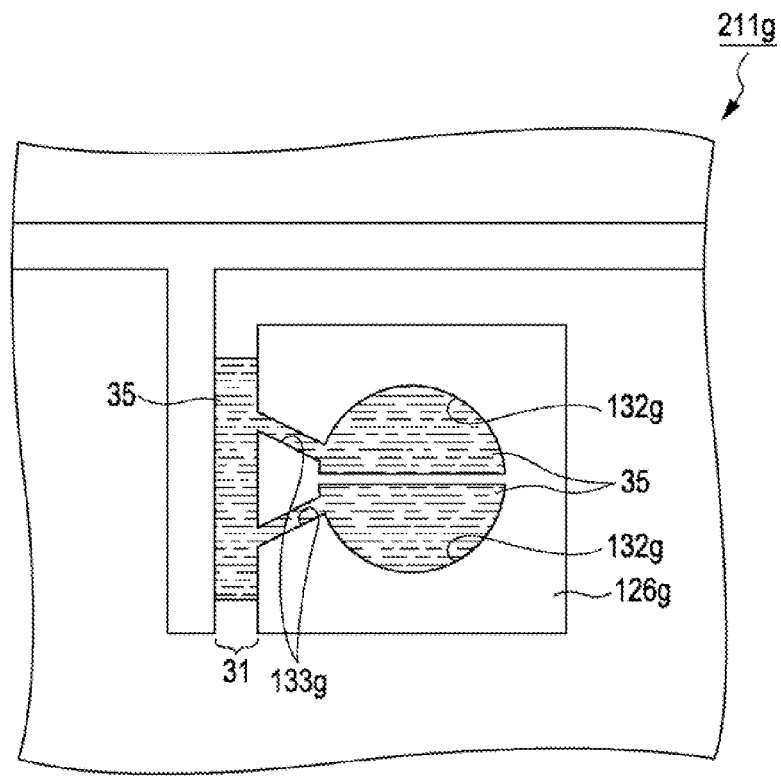
FIG. 17 is a plan view schematically illustrating the configuration of another modification of the semiconductor device.

In the semiconductor device 211g illustrated in FIG. 17, a receiving section 132g and an opening 133g are individually divided into two segments. A region that is positioned between the two segments of the opening 133g is electrically connected to a drain electrode 126g through a thin partition that divides the receiving section 132g. For example, the thin partition is configured so as to have a height of 100 nm. The thin partition may be configured so as to have a width of less than or equal to 5 μm, and such a width almost never affect the flowability of liquid. By virtue of this configuration, as compared with the receiving section 132c of the semiconductor device 211c illustrated in FIG. 13, a channel width can be sufficiently secured.

Figure 18:
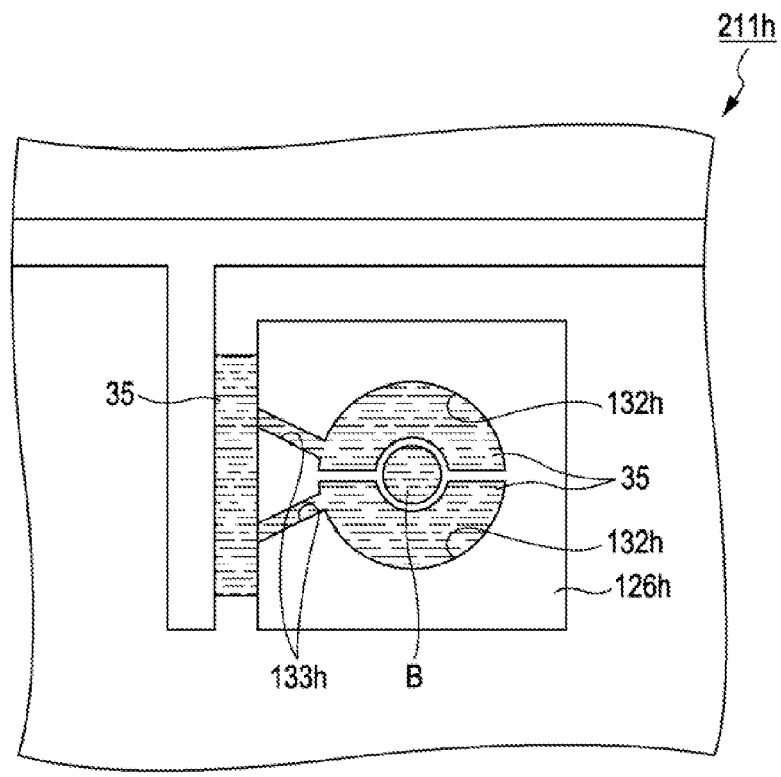
FIG. 18 is a plan view schematically illustrating the configuration of another modification of the semiconductor device.

In the semiconductor device 211h illustrated in FIG. 18, as in the case of the semiconductor device 211g illustrated in FIG. 17, a receiving section 132h and an opening 133h are individually divided into two segments. A region that is positioned between the two segments of the opening 133h is electrically connected to a drain electrode 126h through a thin partition that divides the receiving section 132h. The thin partition forms a rounded shape at the center of the receiving section 132h. A region B which is surrounded by the thin partition that forms the rounded shape is not provided with an electrical conductor. The thin partition has the height the same as that in the semiconductor device 211g illustrated in FIG. 17. By virtue of this configuration, as compared with the receiving section 132c of the semiconductor device 211c illustrated in FIG. 13, a channel width can be sufficiently secured.

Figure 19:
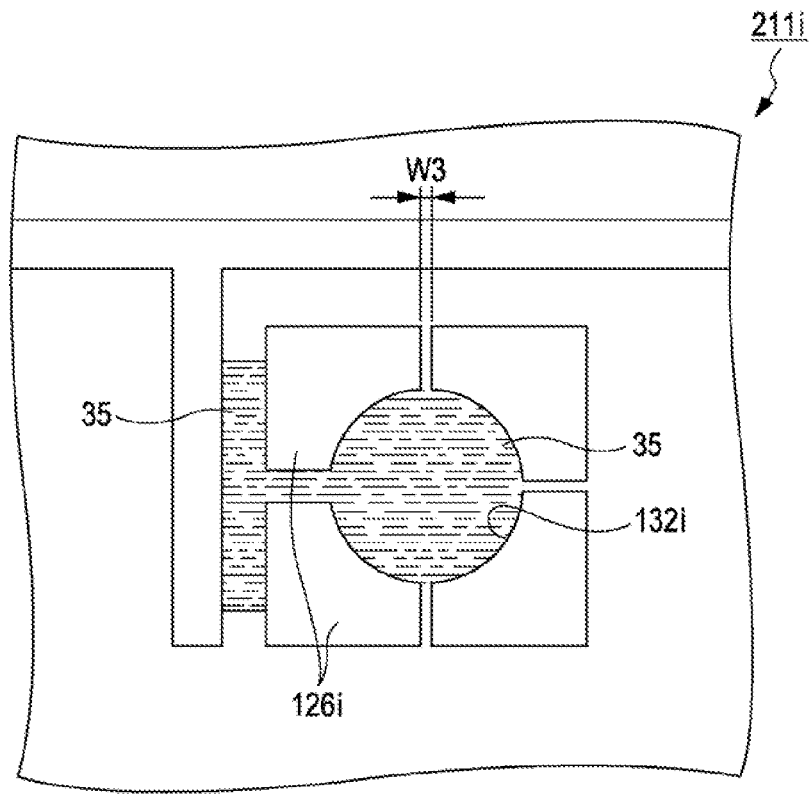
FIG. 19 is a plan view schematically illustrating the configuration of another modification of the semiconductor device.

In the semiconductor device 211i illustrated in FIG. 19, a receiving section 132i is not divided, and a drain electrode 126i is divided. A gap W3 through which the liquid 35 is prevented from flowing is configured so as to have a width of, for example, less than or equal to 5 μm. By virtue of this configuration, the receiving section 132i is divided into several segments, and the segments are individually isolated, so that the electric capacitance of an electrode film that is formed as a receptor can be reduced.

Figure 20:
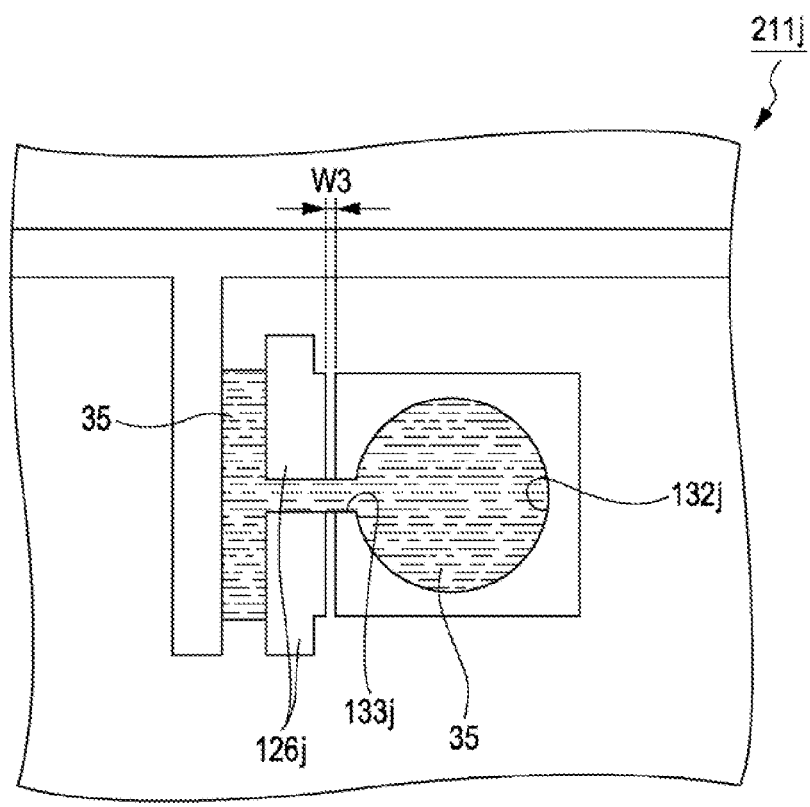
FIG. 20 is a plan view schematically illustrating the configuration of another modification of the semiconductor device.

In the semiconductor device 211j illustrated in FIG. 20, an opening 133j is not divided, and a drain electrode 126j is divided. As in the case illustrated in FIG. 19, the gap W3 through which the liquid 35 is prevented from flowing is configured so as to have a width of, for example, less than or equal to 5 μm. By virtue of this configuration, the electric capacitance of an electrode film that is formed as a receptor can be reduced.

Third Modification

Figure 21:
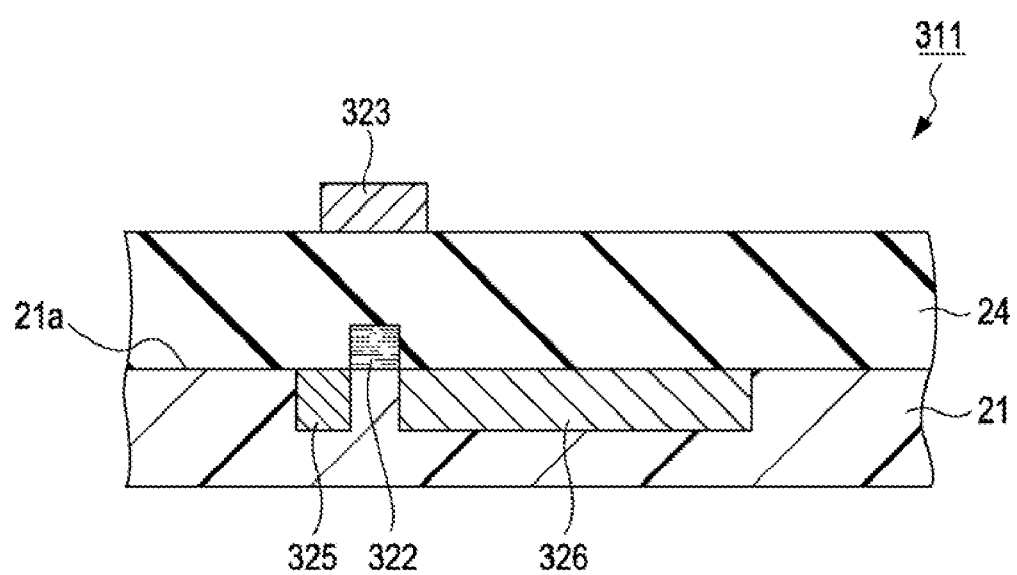
FIG. 21 is a cross-sectional view schematically illustrating the configuration of another modification of the semiconductor device.

As described above, the source electrode 25 and the drain electrode 26 are formed on the substrate 21, and the liquid 35 is spread in accordance with the configurations thereof. However, in place of such constitution, the configuration illustrated in FIG. 21 may be employed, for example. In a semiconductor device 311 illustrated in FIG. 21, a source electrode 325 and a drain electrode 326 are formed so as to be embedded into the substrate 21. Namely, the upper surface 21a of the substrate 21 is flush with the upper surfaces of the source electrode 325 and drain electrode 326. In this configuration, the upper surfaces of the substrate 21, source electrode 325, and drain electrode 326 are configured so as to be flush with each other, but the liquid 35 can be spread in accordance with the configurations of the source electrode 325 and drain electrode 326 owing to the difference in wetting properties and the like thereof, thereby being able to form the semiconductor layer 322.

Fourth Modification

As described above, the source electrode 25 and the drain electrode 26 are formed, and the liquid 35 is spread in accordance with the configurations thereof. However, in place of such constitution, insulators may be formed on the source electrode 25 and the drain electrode 26 so as to have the shapes the same as those of the source electrode 25 and the drain electrode 26 (insulator-forming process), for example. By virtue of this configuration, the heights of the receiving section 32 and opening 33 are increased in accordance with the shapes thereof, and therefore the liquid 35 can be more stably spread. Furthermore, the droplet 35a that has been ejected from the ejection head 41 can be prevented from being splashed from the receiving section 32 to the outside.

Furthermore, the source electrode 25 and the drain electrode 26 are formed by using a photolithographic technique, and resist patterns (resist films) that have been formed during the photolithography process may be left on the source electrode 25 and the drain electrode 26. By virtue of this configuration, the heights of the receiving section 32 and opening 33 can be increased in accordance with the shapes thereof without separately forming insulators.

Fifth Modification

The source electrode 25 and the drain electrode 26 may be subjected to liquid repellent treatment. Examples of the liquid repellent treatment include fluorine-based plasma treatment and fluorine-based thiol treatment. By virtue of this configuration, the liquid 35 can be prevented from being spread on the electrodes (source electrode 25 and drain electrode 26). Examples of a material not having a thiol (—SH) group include organic compounds having sulfur-containing functional groups, such as compounds having a disulfide (—S—S—) group or a monosulfide (—S—) group and thiophene. Among them, an organic compound having the thiol group or the disulfide group is preferable, and an organic compound having the thiol group is especially preferable.

Furthermore, the insulator and resist film described in the fourth modification may be subjected to the liquid repellent treatment. Moreover, a liquid repellent material may be used for the resist film.

Sixth Modification

The semiconductor device 11 is not limited to the above application as a transistor and may be used as a sensor, for example.

Seventh Modification

The substrate 21 is not limited to the above plastic substrate, and other types of substrates such as a glass substrate, a quartz substrate, a silicon substrate, a metallic substrate using aluminum and stainless steel, and a gallium arsenide substrate may be used.

Eighth Modification

The application of the semiconductor device 11 is not limited to the electrophoretic display device 51. For example, the semiconductor device 11 may be applied to a liquid crystal apparatus, an organic electroluminescence (EL) apparatus, or a plasma display.

Ninth Modification

The electronic apparatus is not limited to the above electronic paper 71. For example, the electronic apparatus may be provided in the form of personal digital assistants; personal computers; digital still cameras; digital video cameras; digital versatile disc (DVD) viewers; automotive displays utilized in, for example, car navigation systems; electronic organizers; point-of-sale terminals; audio apparatuses; and electronic advertising media such as digital signages.

What is claimed is:

1. A semiconductor device comprising:
   a substrate;
   a first electrode and a second electrode, each being formed on the substrate;
   a first region that is positioned between the first electrode and the second electrode;
   a second region that is connected with the first region;
   an organic semiconductor layer that is provided in the first region and in the second region; and
   a receptor of the organic semiconductor layer, the receptor being provided so as to surround the organic semiconductor layer in the second region and having an opening that extends from the second region to the first region, wherein
   the organic semiconductor layer in the first region forms a channel region;
   the organic semiconductor layer in the second region does not form a channel region; and
   the organic semiconductor layer in the first region is not surrounded by the receptor.

2. The semiconductor device according to claim 1, wherein a conductive material is used to form the receptor.

3. The semiconductor device according to claim 1, wherein the receptor is formed in one of the first electrode and the second electrode.

4. The semiconductor device according to claim 1, wherein an insulator is provided at least on the upper surface of the receptor.

5. The semiconductor device according to claim 1, wherein liquid repellent treatment is applied at least on the upper surface of the receptor.

6. The semiconductor device according to claim 1, wherein the receptor is divided into a plurality of segments.

7. An electronic apparatus comprising the semiconductor device according to claim 1.

8. An electronic apparatus comprising the semiconductor device according to claim 2.

9. An electronic apparatus comprising the semiconductor device according to claim 3.

10. An electronic apparatus comprising the semiconductor device according to claim 4.

11. An electronic apparatus comprising the semiconductor device according to claim 5.

* * * * *